(12) United States Patent  
Chang

(10) Patent No.: US 8,949,697 B1  
(45) Date of Patent: Feb. 3, 2015

(54) LOW POWER REED-SOLOMON DECODER

(71) Applicant: Marvel International Ltd., Hamilton (BM)

(72) Inventor: Yuan-Mao Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 165 days.

(21) Appl. No.: 13/647,723

(22) Filed: Oct. 9, 2012

Related U.S. Application Data

(60) Provisional application No. 61/545,958, filed on Oct. 11, 2011.

(51) Int. Cl.
*H03M 13/00* (2006.01)
*H03M 13/15* (2006.01)

(52) U.S. Cl.
CPC ........ *H03M 13/153* (2013.01); *H03M 13/6502* (2013.01)
USPC ............................ 714/781; 714/785; 708/492

(58) Field of Classification Search
CPC .......... H03M 13/1535; H03M 13/158; H03M 13/1515; H03M 13/1595; H03M 13/151; H03M 13/6508; H03M 13/00; H03M 13/153; H03M 13/1545; H03M 13/1555; H03M 13/6502; H03M 13/6561; G06F 7/726; H04L 1/0057
USPC .................. 714/784, 785, 782, E11.032, 757, 714/E11.033, 704, 746, 774, 776; 708/492
See application file for complete search history.

(56) References Cited

U.S. PATENT DOCUMENTS

2010/0131807 A1 * 5/2010 Truong et al. ................. 714/704
2010/0299580 A1 * 11/2010 Neznanov et al. ............ 714/782

* cited by examiner

*Primary Examiner* — Guy Lamarre

(57) ABSTRACT

Systems, methods, apparatus, and techniques are provided for decoding a codeword. A plurality of syndrome values is received corresponding to a received codeword and a value of an error locator polynomial corresponding to the received codeword is initialized. The value of the error locator polynomial is iteratively updated by processing the plurality of syndrome values, where each iterative update includes determining a current degree of the error locator polynomial and terminating the iterative updating in response to a determination that the current degree of the error locator polynomial exceeds a threshold value.

20 Claims, 7 Drawing Sheets

LOW POWER REED-SOLOMON DECODER

CROSS-REFERENCE TO RELATED APPLICATIONS

This application claims the benefit under 35 U.S.C. §119 (e) of U.S. Provisional Application No. 61/545,958, filed Oct. 11, 2011, which is incorporated herein by reference in its respective entirety.

FIELD OF USE

This invention relates to efficient decoding techniques for Reed-Solomon decoders and other types of information decoders. Because Reed-Solomon decoding techniques are relatively complex, practical issues generally concern whether decoding operations can be completed in an acceptable amount of time while using an acceptable amount of power.

BACKGROUND

Reed-Solomon decoders typically use a Berlekamp-Massey process to determine an error locator polynomial for a given codeword and a Chien search to find the roots of the error-locator polynomial (i.e., symbol error locations). The Berlekamp-Massey process/Chien search technique may be inefficient. For example, during the Berlekamp-Massey process phase, such techniques may perform extraneous calculations or may perform calculations in another suboptimal manner. For example, such techniques may continue to perform Berlekamp-Massey or Chien search iterations after a point at which prior calculations establish that full and proper decoding of the codeword is not possible.

SUMMARY

Described herein is a decoder for decoding a received codeword. The decoder includes an error locator polynomial determination module configured to receive a plurality of syndrome values corresponding to the received codeword and iteratively update a value of an error locator polynomial initialized to the received codeword by processing the plurality of syndrome values. Further, each iterative update includes determining a current degree of the error locator polynomial and terminating the iterative updating in response to a determination that the current degree of the error locator polynomial exceeds a threshold value.

In certain implementations of the decoder, the error locator polynomial determination module is further configured to determine a discrepancy parameter, compare the discrepancy parameter to a threshold value in response to a determination that a performed number of iterations of the iterative updating is equal to a number of parity bits in the received codeword, and selectively initiate a Chien search based on the comparison. In certain implementations of the decoder, the roots and error value determination module is further configured to determine whether a double root condition is present in the error locator polynomial and declare a decoding failure in response to determining that the double root condition is present.

Also described herein are techniques for decoding a codeword. A plurality of syndrome values is received corresponding to the received codeword, a value of an error locator polynomial corresponding to the received codeword is initialized, and the value of the error locator polynomial is iteratively updated by processing the plurality of syndrome values, where each iterative update comprises determining a current degree of the error locator polynomial, and terminating the iterative updating in response to a determination that the current degree of the error locator polynomial exceeds a threshold value.

In certain implementations of these techniques for decoding a codeword, a discrepancy parameter is determined, the discrepancy parameter is compared to a threshold value in response to a determination that a performed number of iterations of the iterative updating is equal to a number of parity bits in the received codeword, and a Chien search is selectively initiated based on the comparison.

In certain implementations of these techniques for decoding a codeword, an error locator polynomial from the error locator polynomial determination module is received and the value of the error locator polynomial is analyzed at a plurality of points in a domain of the error locator polynomial. Further, the evaluation at a given point comprises determining a value of error locator polynomial at the point and determining a value of a derivative of the error locator polynomial at the point.

In certain implementations of these techniques for decoding a codeword, it is determined whether a double root condition is present in the error locator polynomial, and a decoding failure is declared in response determining that the double root condition is present.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

For the purposes of illustration, and not limitation, the disclosed methods, systems, and apparatus are described in terms of (n, k, m) Reed-Solomon encoding, in which k message symbols, denoted $m_0, \ldots, m_{k-1}$, respectively, are transformed into a codeword of n symbols, denoted $c_0, \ldots, c_{n-1}$, respectively. The number of check (also referred to as parity)

symbols in the codeword is therefore n−k. The bit-depth of each symbol of the codeword is denoted by m and takes on a value from the Galois Field of order $2^m$ (hereinafter denoted $GF(2^m)$). For example, a Reed-Solomon encoding scheme in which k=239 message symbols are encoded into n=255 coded symbols and having a depth of m=8 bits per symbol is denoted as a (255, 239, 8) Reed-Solomon code. The (n, k, m) Reed-Solomon code is a maximum-distance-separable code meaning that the minimum hamming distance between any two words in the code is n−k+1 symbol positions. Thus, it is possible to correct up to $\lfloor t \rfloor = \lfloor (n-k)/2 \rfloor$ symbol errors in corrupted or noisy Reed-Solomon codeword.

As would be understood by one of ordinary skill in the art, based on the disclosure and teachings herein, a message may be represented by a message polynomial, m(x), which has the form $$m(x) = m_0 + m_1 x + m_2 x^2 + \ldots + m_{k-1} x^{k-1}.$$

where $m_0, \ldots, m_{k-1}$, are the message coefficients described above. Further, a codeword polynomial c(x) may be produced from the message polynomial m(x) using a generator polynomial g(x) 124

$$g(x) = (x+a)(x+a^2) \ldots (x+a^{2t}) = g_0 + g_1 x + g_2 x^2 + \ldots + g_{2t-1} x^{2t-1} + x^{2t},$$

where g(x) is the generator polynomial having coefficients $g_0, \ldots g_{2t-1}$, each taking on a value from $GF(2^m)$, a is a base root of the generator polynomial, and 2t is the degree of the generator polynomial. Specifically, the codeword c(x) is produced through the multiplication $$c(x) = g(x)m(x)$$

and can be expressed as $$c(x) = c_0 + c_1 x + c_2 x^2 + \ldots + c_{n-1} x^{n-1}$$

where $c_0, \ldots, c_{n-1}$ are codeword coefficients. For the purposes of illustration, and not limitation, this disclosure describes systematic Reed-Solomon encoding in which the n−k parity check symbols are effectively appended to message symbols. Thus, $c_0 = m_0, c_1 = m_1, \ldots, c_{k-1} = m_{k-1}$.

Figure 1A:
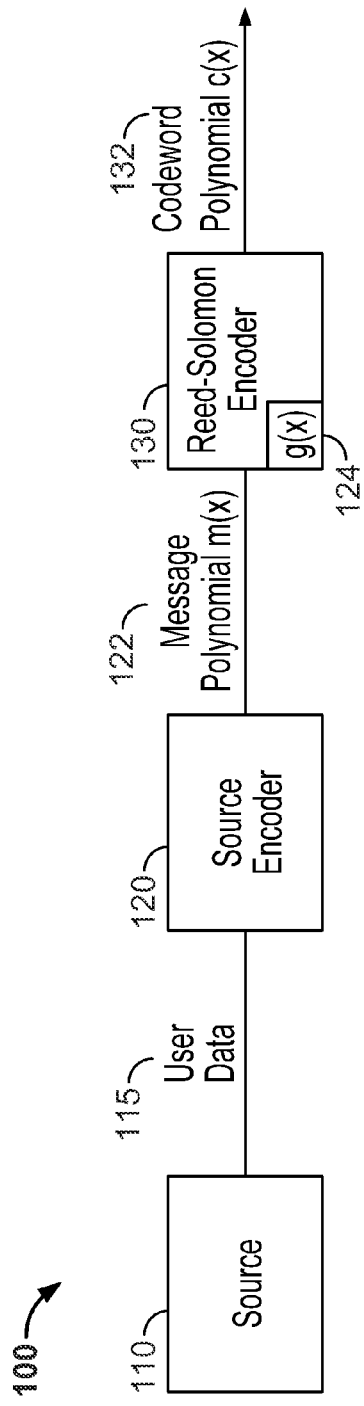
FIG. 1A illustrates a Reed-Solomon encoding architecture in accordance with some embodiments.

FIG. 1A illustrates a Reed-Solomon encoding architecture 100 in accordance with some embodiments. User data 115 is produced by a source 110. A source encoder 120 removes information redundancy from the user data 115 to output a message polynomial m(x) 122. A Reed-Solomon channel encoder 130 produces a codeword polynomial c(x) 132 by performing the polynomial multiplication c(x)=g(x)m(x). The Reed-Solomon channel encoder 130 then outputs the codeword polynomial c(x) 132.

Figure 1B:
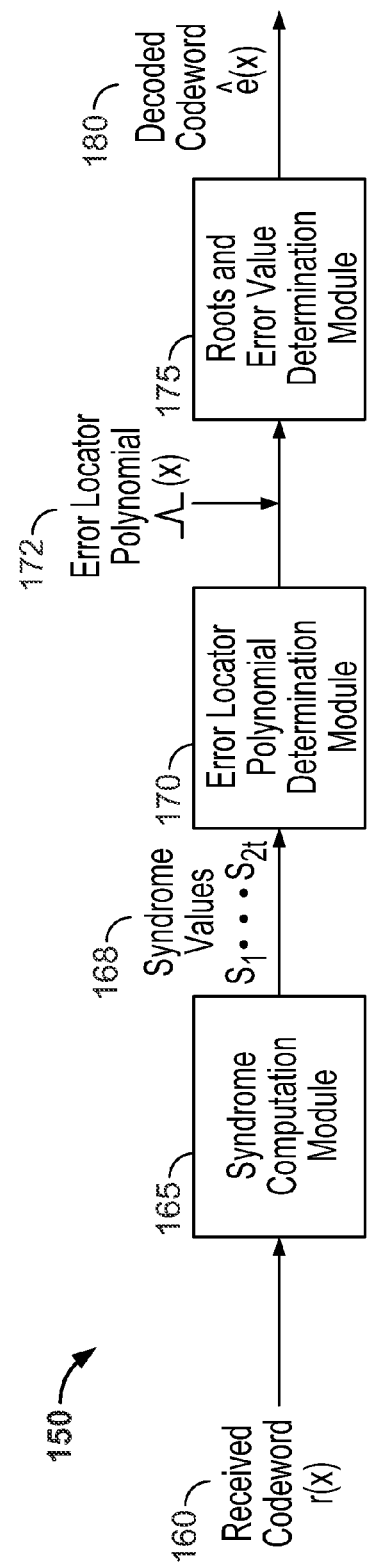
FIG. 1B illustrates a Reed-Solomon decoding architecture in accordance with some embodiments.

FIG. 1B illustrates a Reed-Solomon decoding architecture 150 in accordance with some embodiments. The decoding architecture 150 obtains a received codeword r(x) 160. The received codeword r(x) 160 may be a corrupted or otherwise modified version of the codeword polynomial c(x) 132, meaning that the value of one or more symbols in the received codeword r(x) 160 differs from their corresponding positions in the codeword polynomial c(x) 132. Such symbol differences may be produced by noise or other artifacts in the transmission of the codeword polynomial c(x) 132 over a communications network.

Syndrome computation module 165 processes the received codeword r(x) 160 to obtain 2t syndrome values $S_1, \ldots, S_{2t}$ 168 corresponding to the received codeword r(x) 160. If the syndrome values $S_1, \ldots, S_{2t}$ 168 are each equal to zero, then the decoding architecture 150 treats the received codeword r(x) 160 as if it contains no symbol errors and outputs the received codeword r(x) as a decoded codeword ĉ(x) 180. If, on the other hand, at least one of the syndrome values $S_1, \ldots, S_{2t}$ 168 is non-zero, then the decoding architecture 150 attempts to identify the positions of the received codeword r(x) 160 that contain errors and, at error locator polynomial determination module 170 and roots and error value determination module 175, correct for the errors.

The error locator polynomial determination module 170 processes the syndrome values $S_1, \ldots, S_{2t}$ 168 to produce an error locator polynomial Λ(x) 172. The roots of the error locator polynomial Λ(x) 172 indicate the symbol positions of errors in the received codeword r(x) 160 that contain symbol errors. In general, the error locator polynomial Λ(x) 172 has the polynomial form $$\Lambda(x) = \Lambda_0 + \Lambda_1 x + \Lambda_2 x^2 + \ldots + \Lambda_t x^t$$

where $\Lambda_0, \ldots, \Lambda_t$ are the coefficients of the error locator polynomial Λ(x) 172. The error locator polynomial determination module 170 may use any suitable technique to determine the roots of the error locator polynomial Λ(x) 172. For example, as described in relation to FIGS. 2, the Berlekamp-Massey process may be used. Alternatively, as described in relation to FIGS. 3 and 6, a modified version of the Berlekamp-Massey process may be used to reduce computations and power requirements compared to the use of a standard Berlekamp-Massey process.

The error locator polynomial Λ(x) 172, or an equivalent representation of it, is provided to the roots and error value determination module 175. The roots and error value determination module 175 processes the error locator polynomial Λ(x) 172 to determine the roots of the error locator polynomial Λ(x) 172, i.e., the locations of symbol errors, and their values, in the received codeword r(x) 160. For example, as described in relation to FIG. 4, the roots and error value determination module 175 may implement a Chien search to determine the location and value of symbol errors in the received codeword r(x) 160. Alternatively, as described in relation to FIGS. 5 and 7, a modified version of the Chien search may be used that reduces computation and power requirements as compared to a standard Chien search. If the roots and error value determination module 175 is capable of correcting the symbol errors in the received codeword r(x) 160, it makes the corrections and outputs the corrected version of the received codeword r(x) 160 rather than a decoded codeword. On the other hand, if there are more errors present in the received codeword r(x) 160 than can be corrected (i.e., more than $\lfloor t \rfloor$ errors), then the roots and error value determination module 175 may output a signal that indicates a decoding failure as the decoded codeword ĉ(x) 180.

Figure 2:
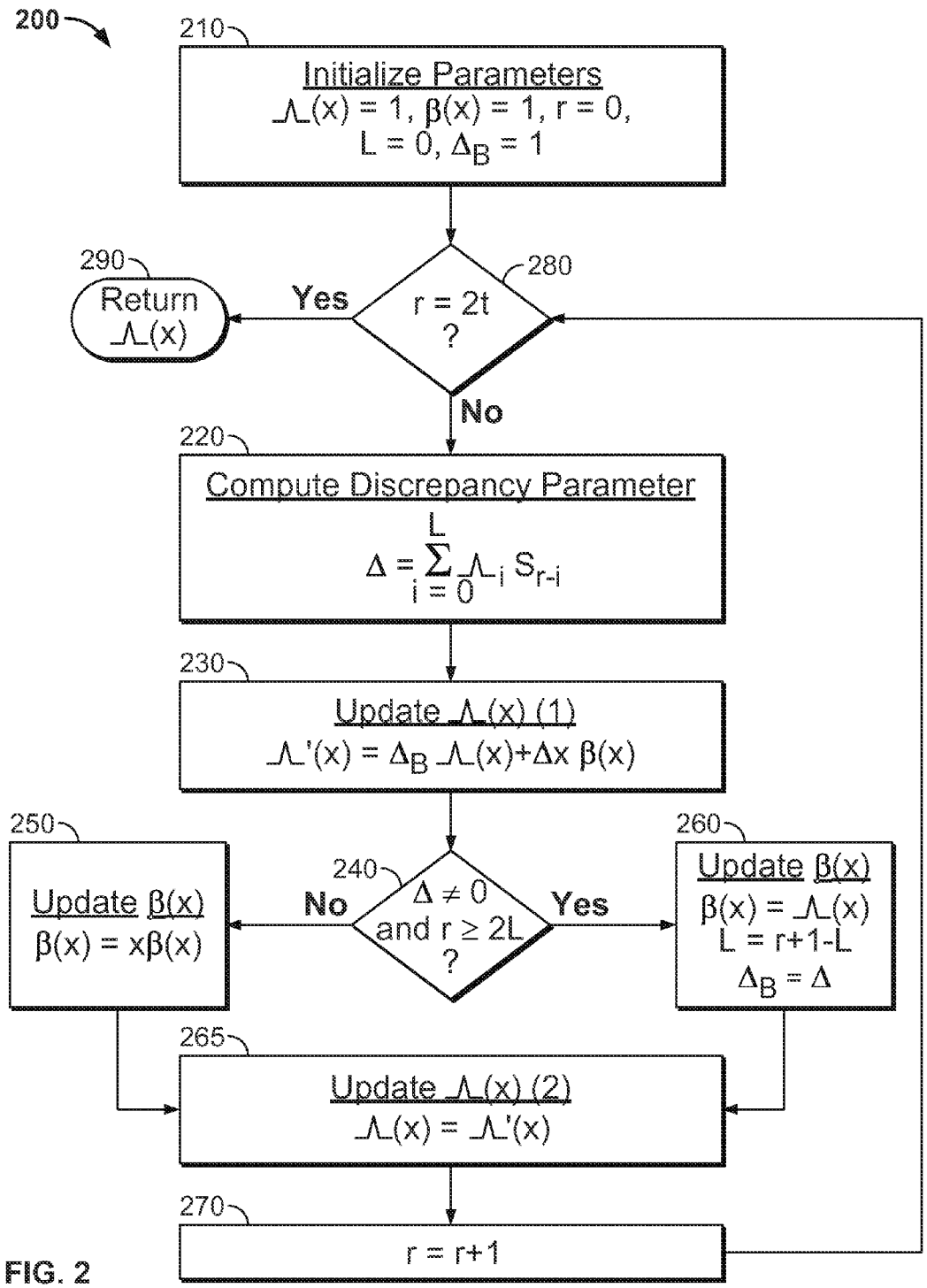
FIG. 2 illustrates a Berlekamp-Massey process for determining an error locator polynomial in accordance with some embodiments.

FIG. 2 illustrates a Berlekamp-Massey process for determining the error locator polynomial Λ(x) 172 in accordance with some embodiments. The error locator polynomial determination module 170 may implement a process 200 in order to produce the error locator polynomial Λ(x) 172. At 210, the process 200 initializes parameters. Specifically, an initial value of the error locator polynomial Λ(x) 172 is initialized to be 1, an initial value of an intermediate polynomial β(x) is initialized to the value 1, a counter variable r is initialized to the value 0, a current degree of the error locator polynomial L is initialized to 0, and a step-size coefficient du is initialized to the value 1.

At 280, the condition r=2t is evaluated. If the condition is satisfied (i.e., true), then the process 200 proceeds to 290 and, at 290, returns the value of the error locator polynomial Λ(x) 172. On the other hand, if the condition r=2t is not satisfied, then the process 200 proceeds to 220, where the value of the discrepancy parameter Δ is computed according to the relationship $$\Delta = \sum_{i=0}^{L} (\Lambda_i S_{r-i})$$

where $\Lambda_i$ is the $i^{th}$ coefficient of the error locator polynomial $\Lambda(x)$ 172 at the time that the discrepancy parameter is computed and $S_i$ is the $i^{th}$ syndrome value from the syndrome values $S_1, \ldots, S_{2t}$ 168. The discrepancy parameter $\Delta$ reflects the relative degree to which the currently-computed error locator polynomial $\Lambda(x)$ 172 approximates the actual error locator polynomial (i.e., a smaller value of the discrepancy parameter $\Delta$ indicates a closer match). The process 200 then proceeds to 230.

At 230, the temporary update function $\Lambda'(x)$ is updated according to the relationship $$\Lambda'(x) = \Delta_B \Lambda(x) + \Delta x \beta(x).$$

The process 200 then proceeds to 240. At 240 the following two conditions are evaluated: $\Delta \neq 0$ and $r > 2L$. If both conditions are satisfied (i.e., true) then the process 200 proceeds to 260 and updates values of the intermediate polynomial $\beta(x)$, step-size coefficient $\Delta_B$, and a current degree of the error locator polynomial L as follows:

$$\beta(x) = \Lambda(x),$$

$$L = r + 1 - L, \text{ and}$$

$$\Delta_B = \Delta.$$

Otherwise, the process 200 proceeds to 250 and updates the value of the intermediate polynomial $\beta(x)$ according to the relationship $$\beta(x) = x\beta(x).$$

From either of 250 and 260, the process 200 proceeds to 270. From 250 and 260, the process 200 proceeds to 265, where the error locator polynomial $\Lambda(x)$ 172 is updated according to the relationship $\Lambda(x) = \Lambda'(x)$. From 265, the process 200 proceeds to 270, where the value of the counter variable r is incremented (i.e., increased by a value of 1). The process 200 then returns to step 280, described above, where the condition r=2t is evaluated.

Figure 3:
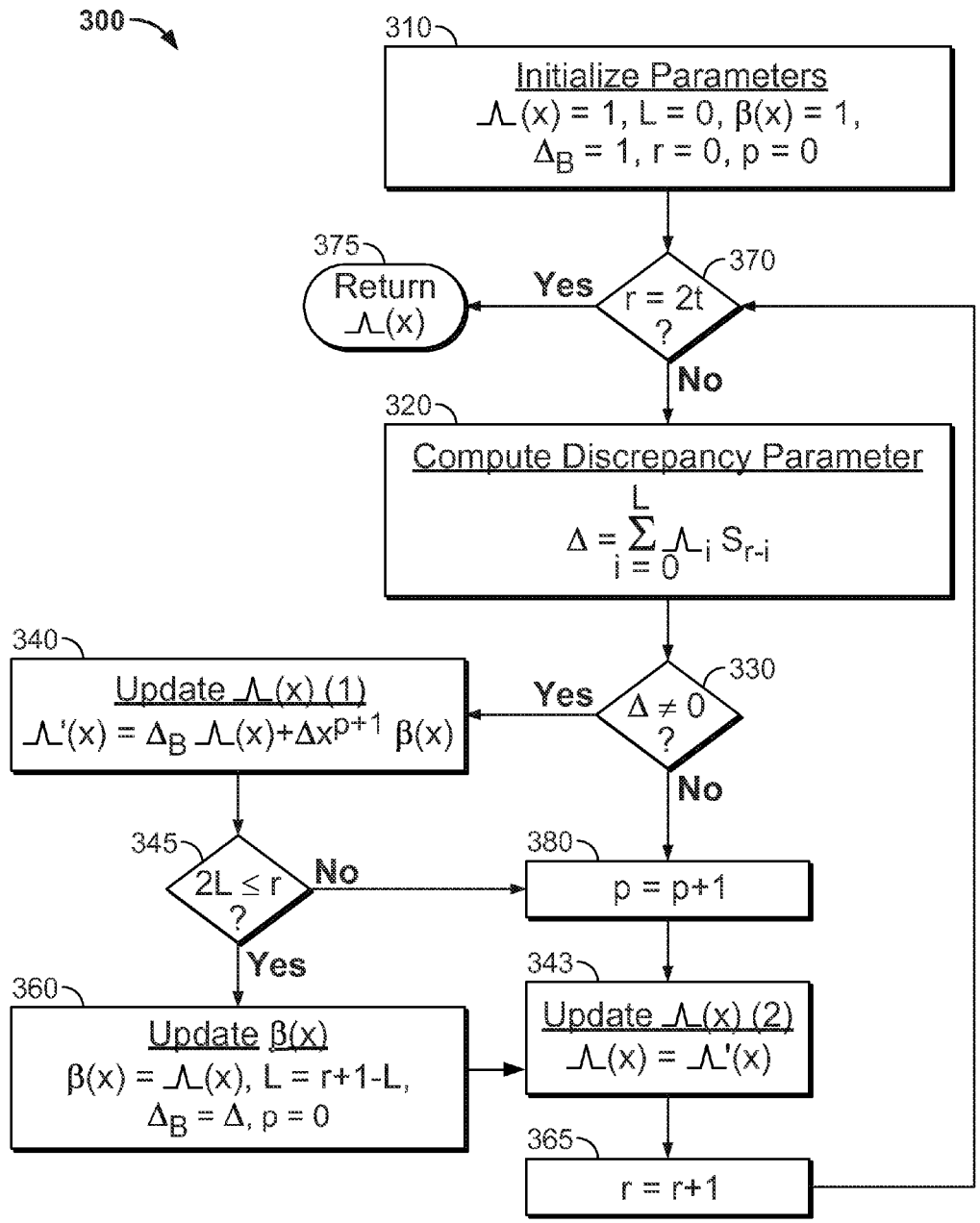
FIG. 3 illustrates a modified version of the Berlekamp-Massey process for determining an error locator polynomial in accordance with some embodiments.

FIG. 3 illustrates a modified version of the Berlekamp-Massey process for determining the error locator polynomial $\Lambda(x)$ 172 in accordance with some embodiments. The error locator polynomial determination module 170 may implement process 300 in order to produce the error locator polynomial $\Lambda(x)$ 172. The process 300 generally requires fewer computations and requires less power than the process 200 in order to determine the error locator polynomial $\Lambda(x)$ 172. These savings result at least because the process 300 incorporates two types of modifications relative to the process 200.

First, the process 300 omits a feature corresponding to 250 of the process 200. In particular, 250 involves a degree shift of the intermediate polynomial $\beta(x)$. However, after this degree shift is computed, it is not actually used by the process 200 until the process 200 next reaches 230. Thus, 250 may be performed one or more times before the corresponding one or more shifts are utilized by the process 200. Accordingly, to increase computational efficiency, the process 300 omits a feature corresponding to 250 of the process 200 and instead increments the counter value p at 340 and 380, exactly one of which is reached if 250 has been reached in the process 200.

The counter value p is a variable that represents the number of unrealized polynomial shifts that would have otherwise been executed at 250 (if such a feature existed in the process 300) so that the unrealized shifts are accounted for when the process 300 next arrives at 340. Accordingly, 340 of the process 300 uses the quantity $x^{p+1}$ rather than the quantity x, which is used at 230 of the process 200. Further, the counter value p is reset to the value 0 at 360. This is because the intermediate polynomial $\beta(x)$ is assigned the value of the error locator polynomial $\Lambda(x)$ 172 at 360, thus rendering moot any accumulated number of unrealized polynomial shifts that would have otherwise been executed when the process 300 next reached 340.

Second, whereas the process 200 updates the error locator polynomial $\Lambda(x)$ 172 at 230, i.e., before checking the condition $\Delta \neq 0$ (and the condition r≥2t), the process 300 updates the error locator polynomial $\Lambda(x)$ 172 at 340, i.e., only after checking the condition $\Delta \neq 0$ and determining that the condition is satisfied. Although this means that the process 300 differs from the process 200, there is no functional impact created by the difference. This is because, when $\Delta = 0$, the equation for updating the currently-computed error locator polynomial $\Lambda(x)$ (see 230 or 340) reduces to $\Lambda(x) = \Lambda_B \Lambda(x)$. Thus, the updated equation simply involves changing the value of the currently-computed error locator polynomial $\Lambda(x)$ by a constant value and therefore does not impact the roots of the currently-computed error locator polynomial $\Lambda(x)$ 172. Accordingly, the process 300 saves computational and power resources by omitting an update to the error locator polynomial $\Lambda(x)$ 172 when $\Delta = 0$, without affecting the ultimate determination of the roots of the currently-computed error locator polynomial $\Lambda(x)$. Having explained some of the advantages of the process 300 in place of the process 200, a full description of the execution of the process 300 is now provided.

At 310, the process 300 initializes certain parameters. Specifically, an initial value of the error locator polynomial $\Lambda(x)$ 172 is initialized to the value 1, an initial value of an intermediate polynomial $\beta(x)$ is initialized to the value 1, a counter variable r is initialized to the value 0, a current degree of the error locator polynomial L is initialized to 0, a step-size coefficient $\Delta_B$ is initialized to the value 1, and a counter value p is initialized to the value 0. At 370, the condition r=2t is evaluated. If the condition is satisfied (i.e., true), then the process 300 proceeds to 375 and, at 375, returns the value of the error locator polynomial $\Lambda(x)$ 172. On the other hand, if the condition r=2t is not satisfied, then the process 300 proceeds to 320, where the value of the discrepancy parameter $\Delta$ is computed according to the relationship $$\Delta = \sum_{i=0}^{L} (\Lambda_i S_{r-i})$$

where $\Lambda_i$ is the $i^{th}$ coefficient of the error locator polynomial $\Lambda(x)$ 172 at the time that the discrepancy parameter is computed and $S_i$ is the $i^{th}$ syndrome value from the syndrome values $S_1, \ldots, S_{2t}$ 168. The discrepancy parameter $\Delta$ reflects the relative degree to which the currently-computed error locator polynomial $\Lambda(x)$ 172 approximates the actual error locator polynomial (i.e., a smaller value of the discrepancy parameter $\Delta$ indicates a closer match). The process 300 then proceeds to 330.

At 330, the condition $\Delta \neq 0$ is evaluated. If the condition $\Delta \neq 0$ is not satisfied, then the process 300 proceeds to 380, where the value of the counter value p is incremented, and the process 300 proceeds to 343. On the other hand, if the condition Δ≠0 is satisfied, then the process 300 proceeds to 340. At 340, the currently-computed function Λ(x) is updated according to the relationship $$\Lambda'(x)=\Delta_B\Lambda(x)+\Delta x^{p+1}\beta(x),$$

and the process 300 proceeds to 345. At 345, the condition r≥2L is evaluated. If the condition is satisfied, then the process 300 proceeds to 360, where the intermediate polynomial β(x), the step-size coefficient $\Delta_B$, the degree of the error locator polynomial L, and the counter value p are each updated according to the following relationships:

$$\beta(x)=\Lambda(x),$$

$$L=r+1-L, \text{ and}$$

$$p=0.$$

From 360, the process 300 proceeds to 343.

On the other hand, if the condition r≥2L is not satisfied at 345, then the process 300 proceeds to 380 where the counter value p is incremented by the value of 1. After executing 343, the process 300 proceeds to 365. At 365, the value of the counter variable r is incremented (i.e., increased by a value of 1) and the process 300 returns to 370. At 370, the condition r=2t is evaluated in the manner described above.

Figure 4:
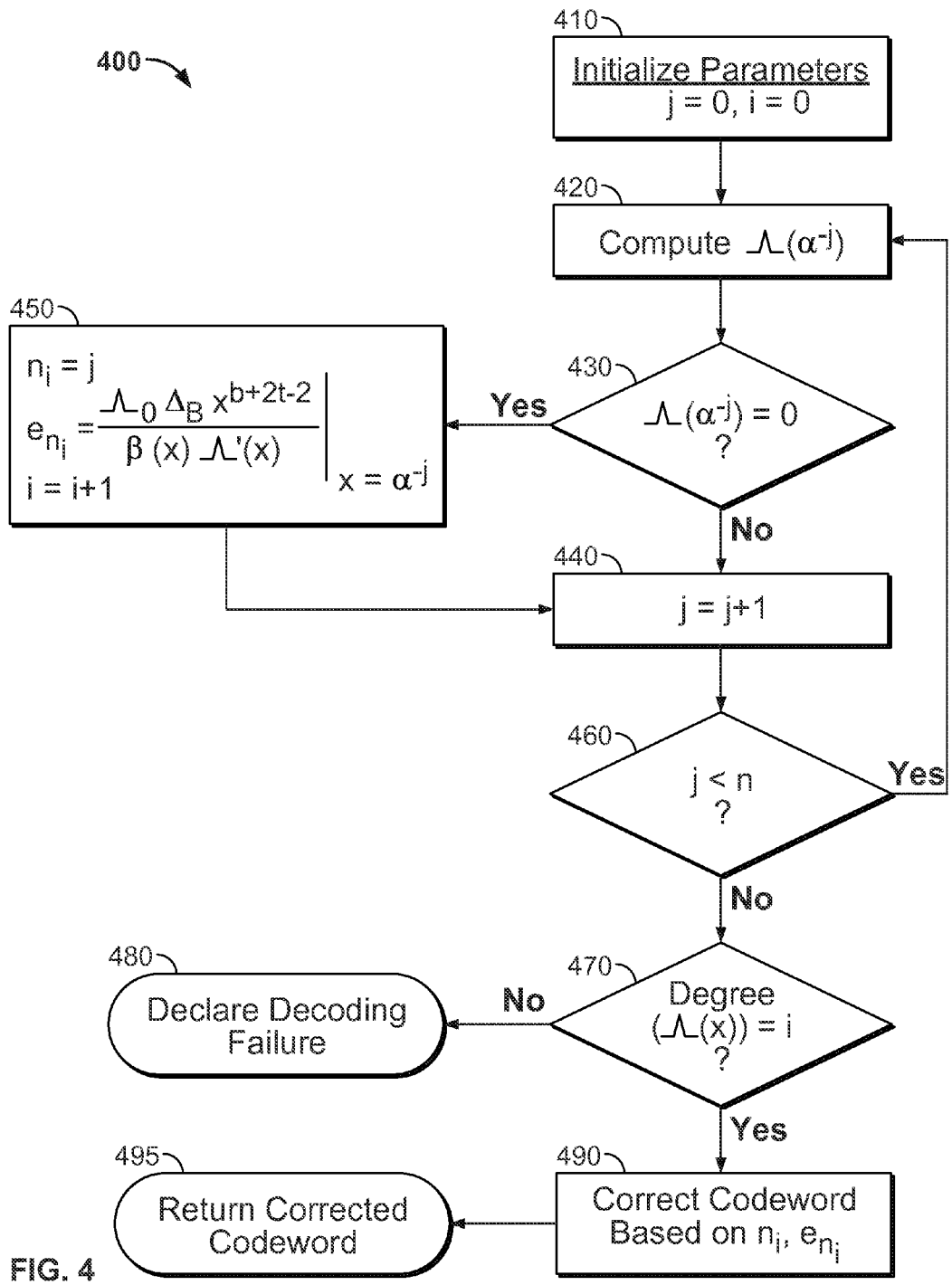
FIG. 4 illustrates a Chien search process for determining the location and value of symbol errors based on a known error locator polynomial in accordance with some embodiments.

FIG. 4 illustrates a Chien search process for determining the location and value of symbol errors based on a known error locator polynomial. In an embodiment, the roots and error value determination module 175 implements process 400 (when the error locator polynomial determination module 170 implements the process 200) in order to determine whether a number of symbol errors in the received codeword r(x) 160 is correctable, and, if the number of symbol errors is correctable, the symbol positions of all errors in the received codeword r(x) 160 and the values of the errors.

At 410, the process 400 initializes a loop control parameter j and a identified errors counter i to the value zero. At 420, the process 400 evaluates error locator polynomial Λ(x) 172 at the $j^{th}$ value in its domain, i.e., evaluates the quantity $\Lambda(\alpha^{-j})$. At 430, the process 400 evaluates the condition $\Lambda(\alpha^{-j})$=0 (i.e., determines whether the error locator polynomial Λ(x) 172 has a root, and thus determines that there exists a corresponding symbol error, at the $j^{th}$ value in its domain). If the condition is true, then the process 400 proceeds to 450 and then to 440. Otherwise, the process 400 proceeds directly to 440.

At 450, the process 400 updates several parameters related to the identification of the symbol error at the current symbol location (i.e., the $j^{th}$ symbol position of the received codeword r(x) 160). Specifically, the process 400 sets the parameter $n_i$=j, which records that the $i^{th}$ error in the received codeword r(x) 160 was found in the $j^{th}$ symbol position of the received codeword r(x) 160. The process 400 further determines $e_{ni}$ at 450, which is the value of the error at the $n_i^{th}$ symbol position and is given by $$e_{ni} = \frac{\Lambda_0 \Delta_B x^{b+2t-2}}{\beta(x)\Lambda'(x)}\bigg|x=\alpha^{-j}.$$

The process 400 further increments the identified errors counter i at 450 to reflect that one additional error in the received codeword r(x) 160 has been identified. The process 400 then proceeds to 440.

At 440, the process 400 increments the loop control parameter j to reflect that an additional point in the domain of the error locator polynomial Λ(x) 172 has been tested, and the process 400 then proceeds to 460. At 460, the condition j<n is tested, where n is the number of unique points in the domain of the error locator polynomial Λ(x) 172. If the condition j<n is satisfied, then additional points in the domain of the error locator polynomial Λ(x) 172 remain to be tested and the process 400 returns to 420 to test another point. On the other hand, if the condition j<n is not satisfied, then the process 400 proceeds to 470.

At 470, the process 400 evaluates the condition degree(Λ(x))=i. If this condition is satisfied, that means that a number of symbol locations found to have errors in the received codeword r(x) 160 is equal to the degree of the error locator polynomial Λ(x) 172, and thus correction of the errors in the received codeword r(x) 160 is possible. Thus, if the condition degree(Λ(x))=i is satisfied, the process 400 proceeds to 490 where the errant symbol locations in the received codeword r(x) 160 are corrected based on the values of $n_i$ and $e_{ni}$ computed at 450. The process 500 then proceeds to 495 and returns the corrected codeword. On the other hand, if the condition degree(Λ(x))=i is not satisfied, then full and complete correction of errors in the received codeword r(x) 160 is not possible. The process 500 thus proceeds to 480 and declares a decoding error.

Figure 5:
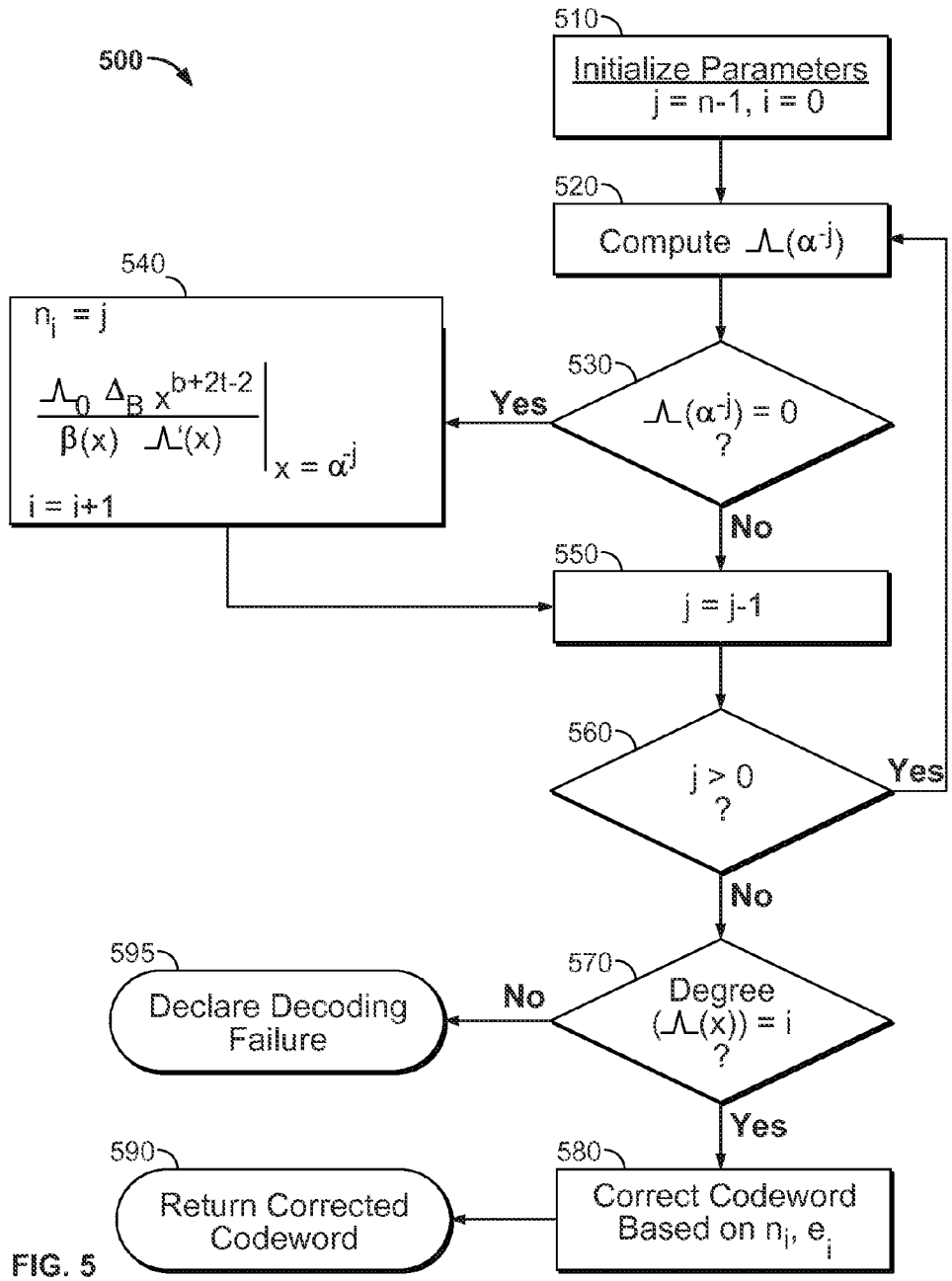
FIG. 5 illustrates a modified Chien search process for determining the location and value of symbol errors based on a known error locator polynomial in accordance with some embodiments.

FIG. 5 illustrates a modified Chien search process for determining the location and value of symbol errors based on a known error locator polynomial. In an embodiment, the roots and error value determination module 175 implements the process 500 (when the error locator polynomial determination module 170 implements the process 300) in order to determine whether a number of symbol errors in the received codeword r(x) 160 is correctable, and, if the number of symbol errors is correctable, the symbol positions of all errors in the received codeword r(x) 160 and the values of the errors.

At 510, the process 500 initializes a loop control parameter j to the value n−1, where n is the number of unique points in the domain of the error locator polynomial Λ(x) 172. The process 500 further initializes an identified errors counter i to the value zero. At 520, the process 500 evaluates error locator polynomial Λ(x) 172 at the $j^{th}$ value in its domain, i.e., evaluates the quantity $\Lambda(\alpha^{-j})$. At 430, the process 400 evaluates the condition $\Lambda(\alpha^{-j})$=0 (i.e., determines whether the error locator polynomial Λ(x) 172 has a root, and thus a symbol error, at the $j^{th}$ value in its domain). If the condition is true, then the process 500 proceeds to 540 before proceeding to 550. Otherwise, the process 500 proceeds directly to 550.

At 540, the process 500 updates several parameters related to the identification of the symbol error at the current symbol location (i.e., the $j^{th}$ symbol position of the received codeword r(x) 160). Specifically, the process 500 sets the parameter $n_i$=j, which records that the $i^{th}$ error in the received codeword r(x) 160 was found in the $j^{th}$ symbol position of the received codeword r(x) 160. The process 500 further determines $e_{ni}$ at 540, which is the value of the error at the $n_i^{th}$ symbol position and is given by $$e_{ni} = \frac{\Lambda_0 \Delta_B x^{b+2t-2}}{\beta(x)\Lambda'(x)}\bigg|x=\alpha^{-j}.$$

The process 500 further increments the identified errors counter i at 540 to reflect that one additional error in the received codeword r(x) 160 has been identified. The process 500 then proceeds to 550.

At 550, the process 500 decrements the loop control parameter j to reflect that an additional point in the domain of the error locator polynomial Λ(x) 172 has been tested, and the process 500 then proceeds to 560. At 560, the condition j>0 is tested. If the condition j>0 is satisfied, then additional points in the domain of the error locator polynomial Λ(x) 172 remain to be tested and the process 500 returns to 520 to test another point. On the other hand, if the condition j>0 is not satisfied, then the process 500 proceeds to 570.

At 570, the process 500 evaluates the condition degree(Λ(x))=i. If this condition is satisfied, that means that a number of symbol locations found to have errors in the received codeword r(x) 160 is equal to the degree of the error locator polynomial Λ(x) 172, and thus correction of the errors in the received codeword r(x) 160 is possible. Thus, if the condition degree(Λ(x))=i is satisfied, the process 500 proceeds to 580 where the errant symbol locations in the received codeword r(x) 160 are corrected based on the values of $n_i$ and $e_{ni}$ computed at 540. The process 500 then proceeds to 590 and returns the corrected codeword. On the other hand, if the condition degree(Λ(x))=i is not satisfied, then full and complete correction of errors in the received codeword r(x) 160 is not possible. The process 500 thus proceeds to 595 and declares a decoding error.

Figure 6:
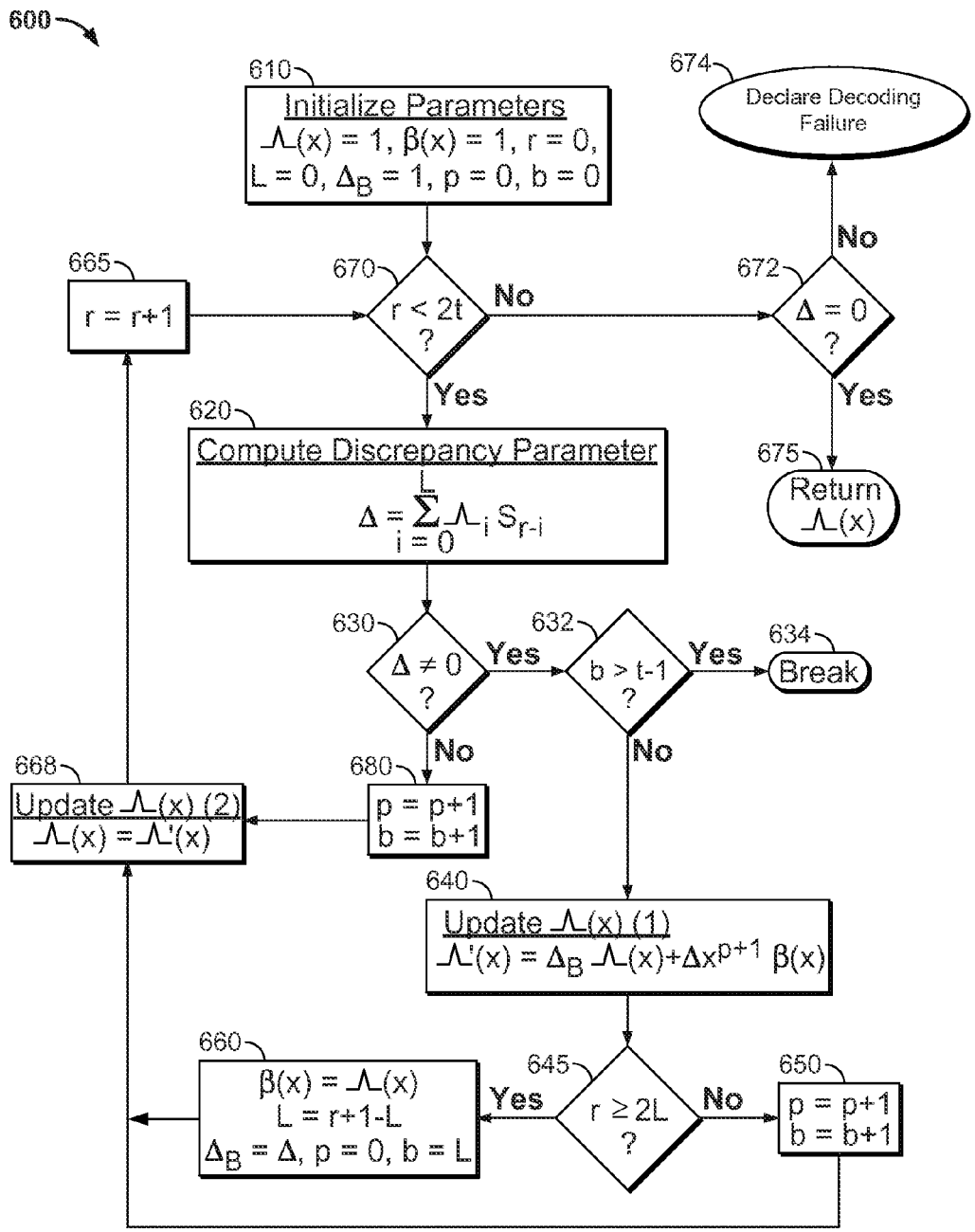
FIG. 6 illustrates yet another modified version of the Berlekamp-Massey process for determining an error locator polynomial in accordance with some embodiments.

FIG. 6 illustrates a modified version of the Berlekamp-Massey process for determining the error locator polynomial Λ(x) 172 in accordance with some embodiments. In an embodiment, the error locator polynomial determination module 170 implements the process 300 in order to produce an error locator polynomial Λ(x) 172 or to determine that complete error correction of the received codeword r(x) 160 is impossible. Process 600 is based on the process 300, discussed above, and additionally allows the error locator polynomial determination module 170 to terminate (or abort) operation early when it is determined that complete error correction of the received codeword r(x) 160 is impossible. As compared to the process 300, the process 600 results in power and time savings by allowing abortion during Berlekamp-Massey calculations (in which case further Berlekamp-Massey calculation and a Chien search calculation are avoided) or at the end of Berlekamp-Massey calculation (in which case a Chien search calculation is avoided).

The process 600 includes features 620, 630, 640, 645, 665, 670, and 675, which correspond to features 320, 330, 340, 345, 365, 370, and 375, respectively, of the process 300. Further, to allow for abortion of decoding during Berlekamp-Massey calculations, the process 600 additionally includes 632 and 634, which do not have corresponding features in the process 300. Further, to allow for abortion of decoding at the end of Berlekamp-Massey calculation, but before Chien search calculations, the process 600 additionally includes 672, which does not have a corresponding feature in the process 300. Additionally, features 610, 632, 650, 660, and 680 have been modified from counterpart features in FIG. 3 to include an additional parameter b. Specifically, the parameter b is initialized to the value 0 at 610, incremented at 650 and 680, and assigned to the value L at 660.

To allow for abortion of decoding during Berlekamp-Massey calculations, the process 600 checks if the condition b>t−1 is satisfied at 632. If the condition is satisfied, then the process 600 continues to 634, where the process breaks. This is because, if b>t−1, then Berlekamp-Massey failed and complete and proper decoding of the received codeword r(x) 160 is not possible. By breaking the decoding process early, computational and power resources are saved compared to the process 300. In some embodiments, the breaking process includes the signaling of a decoding error. If, on the other hand, the condition b>t−1 is not satisfied at 632, then the process 600 continues to 640.

Further, to allow for abortion of decoding during Berlekamp-Massey calculations, the process 600 checks if the condition Δ=0 is satisfied at 672. If the condition is not satisfied (i.e., at the end of the Berlekamp-Massey decoding), then complete and proper decoding of the received codeword r(x) 160 will not be possible. Accordingly, the process 600 proceeds to 674, breaks, and declares a decoding without performing a Chien search. On the other hand, if the condition Δ=0 is satisfied at 672, then complete and proper decoding of the received codeword r(x) 160 may be possible. Accordingly, the process 600 proceeds to 675.

Figure 7:
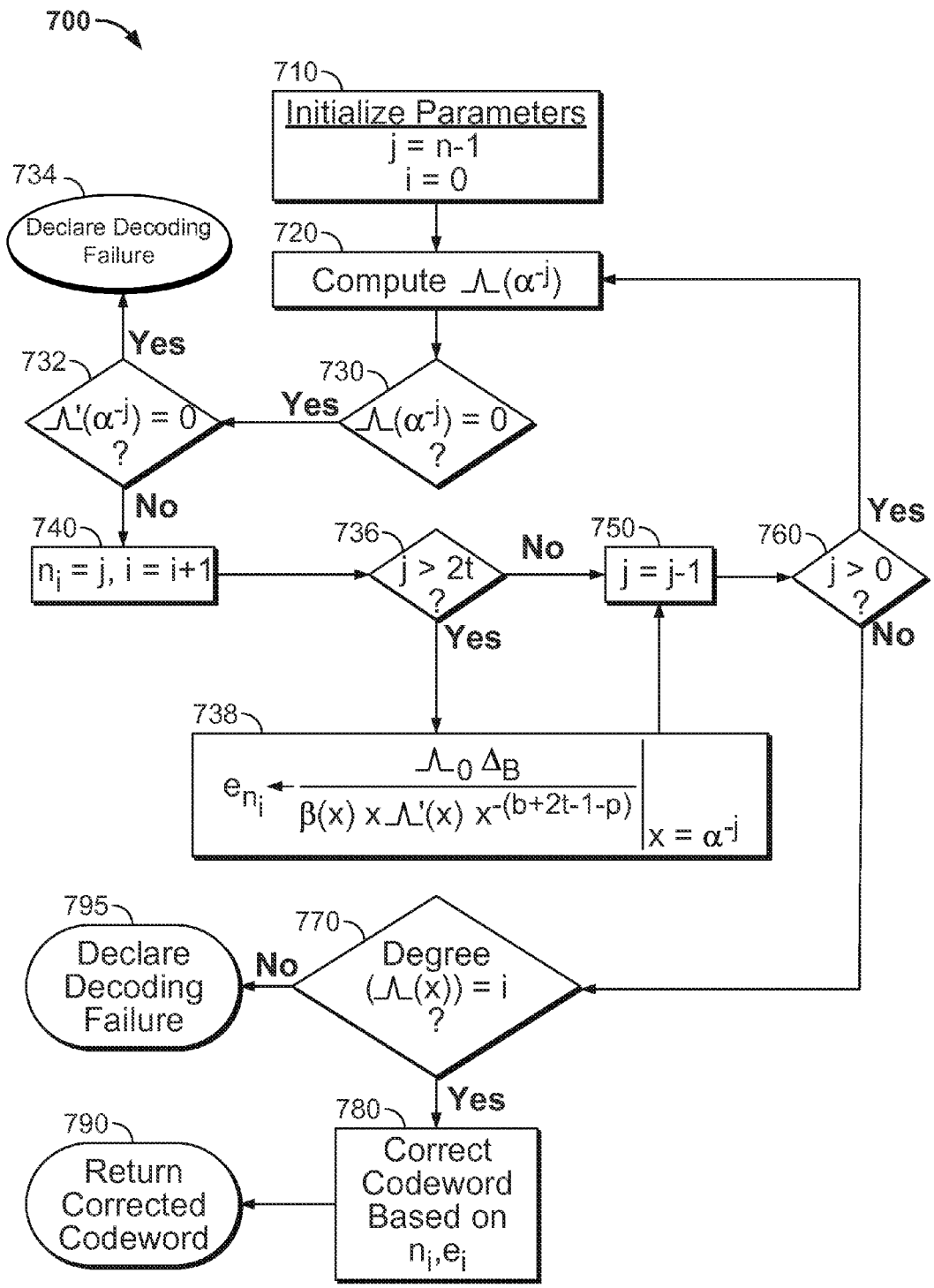
FIG. 7 illustrates yet another modified Chien search process for determining the location and value of symbol errors based on a known error locator polynomial.

FIG. 7 illustrates a modified Chien search process for determining the location and value of symbol errors based on a known error locator polynomial. In an embodiment, the roots and error value determination module 175 implements the process 500 (when the error locator polynomial determination module 170 implements the process 300) in order to determine if a number of symbol errors in the received codeword r(x) 160 is correctable, and, if the number of symbol errors is correctable, the symbol positions of all errors in the received codeword r(x) 160 and the values of the errors. Process 700 is based on the process 500, described above, and additionally allows the roots and error value determination module 175 to abort the Chien search process (and thus reduce computational, power, and time requirements for decoding) when it becomes known that the received codeword r(x) 160 cannot be properly decoded.

The process 700 includes features 710, 720, 730, 750, 760, 770, 780, 790, and 795 which correspond to features 510, 520, 530, 550, 560, 570, 580, 590, and 595, respectively, of the process 500. Further, the process 700 includes 732 and 734 which allow termination of the process 700 upon determination that double roots of error locator polynomial Λ(x) 172 were found by the Chien search of the process 700 (implying that the Chien search process has failed). In particular, the condition Λ'(α$^{-j}$)=0 is evaluated at 732. If the condition is satisfied, this indicates that double roots of error locator polynomial Λ(x) 172 were found by the Chien search of the process 700 and the process 700 proceeds to 734, where the process is terminated and a decoding failure is declared. On the other hand, if the condition Λ'(α$^{-j}$)=0 is not satisfied at 732, then the process 700 proceeds to 750.

Further, the process 700 replaces 540 of the process 500 with 736, 738, and 740. The purpose of including 736, 738, and 740 in place of 540 is to save computational, time, and power resources by not evaluating the error term $e_{ni}$ at symbol locations that correspond to parity bits of the received codeword r(x) 160 since decoding need not be materially affected by the presence of errors in the parity bits and so these errors do not need to be corrected.

At 736, the condition j>2t is evaluated. If this condition is satisfied then the identified symbol error in the $n_i^{th}$ symbol position is a data symbol, rather than a parity symbol, and so the process 700 proceeds to the 738. At 738, the process 700 determines the value of the error at the $n_i^{th}$ symbol position according to the relationship $$e_{ni} = \left. \frac{\Lambda_0 \Delta_B x^{b+2t-1-p}}{\beta(x) x \Lambda'(x)} \right| x = \alpha^{-j}.$$

The process 700 then proceeds to 750. On the other hand, if the condition j>2t is not satisfied at the 736, then the identified symbol error in the $n_i^{th}$ symbol position is a parity symbol, for which error correction is not required. Accordingly, the process 700 omits the use of resources to compute the value of $e_{ni}$ and instead proceeds directly to 750.

The above described implementations are presented for the purposes of illustration and not of limitation. Other embodiments are possible and one or more parts of techniques described above may be performed in a different order (or concurrently) and still achieve desirable results. In addition, techniques of the disclosure may be implemented in hardware, such as on an application specific integrated circuit (ASIC) or on a field-programmable gate array (FPGA). The techniques of the disclosure may also be implemented in software.

What is claimed is:

1. A decoder for decoding a received codeword, the decoder comprising:
   an error locator polynomial determination module configured to:
      receive a plurality of syndrome values corresponding to the received codeword, and
      iteratively update a value of an error locator polynomial initialized to the received codeword by processing the plurality of syndrome values, wherein each iterative update comprises:
         determining a current degree of the error locator polynomial,
         updating a number of errors, and
         terminating the iterative updating in response to a determination that the current degree of the error locator polynomial exceeds a maximum number of correctable errors of the received codeword.

2. The decoder of claim 1, wherein the error locator polynomial determination module is further configured to:
   determine a discrepancy parameter;
   compare the discrepancy parameter to a threshold value in response to a determination that a performed number of iterations of the iterative updating is equal to a number of parity bits in the received codeword; and
   selectively initiate a Chien search based on the comparison.

3. The decoder of claim 1, wherein the error locator polynomial determination module is further configured to:
   initialize a degree counter parameter; and
   increment a value of the degree counter parameter during each iteration of the iterative updating in which the error locator polynomial is not modified.

4. The decoder of claim 1, wherein the iterative updating of the value of the error locator polynomial is performed based on a Berlekamp-Massey algorithm.

5. The decoder of claim 1, further comprising a roots and error value determination module configured to:
   receive the error locator polynomial from the error locator polynomial determination module; and
   analyze the value of the error locator polynomial at a plurality of points in a domain of the error locator polynomial, wherein the evaluation at a given point comprises:
      determining a value of error locator polynomial at the point; and
      determining a value of a derivative of the error locator polynomial at the point.

6. The decoder of claim 5, wherein the analyzing the value of the error locator polynomial at a plurality of points is performed based on a modified Chien search.

7. The decoder of claim 1, wherein the roots and error value determination module is further configured to:
   determine whether a double root condition is present in the error locator polynomial; and
   declare a decoding failure in response to determining that the double root condition is present.

8. The decoder of claim 1, wherein the error locator polynomial determination module is further configured to terminate a scheduled modified Chien search in response to a determination that a current degree of the error locator polynomial exceeds a threshold value.

9. The decoder of claim 1, wherein the error locator polynomial determination module is further configured to determine:
   a plurality of locations in the received codeword that include a symbol error; and
   an error value associated with each of the determined plurality of locations.

10. The decoder of claim 1, wherein each iterative update further comprises:
    computing a discrepancy parameter based on the error locator polynomial and the plurality of syndrome values.

11. A method for decoding a codeword, the method comprising:
    receiving a plurality of syndrome values corresponding to the received codeword;
    initializing a value of an error locator polynomial corresponding to the received codeword; and
    iteratively updating the value of the error locator polynomial by processing the plurality of syndrome values, wherein each iterative update comprises:
       determining a current degree of the error locator polynomial,
       updating a number of errors, and
       terminating the iterative updating in response to a determination that the current degree of the error locator polynomial exceeds a maximum number of correctable errors of the received codeword.

12. The method of claim 11, further comprising:
    determining a discrepancy parameter;
    comparing the discrepancy parameter to a threshold value in response to a determination that a performed number of iterations of the iterative updating is equal to a number of parity bits in the received codeword; and
    selectively initiating a Chien search based on the comparison.

13. The method of claim 11, further comprising:
    initializing a degree counter parameter; and
    incrementing a value of the degree counter parameter during each iteration of the iterative updating in which the error locator polynomial is not modified.

14. The method of claim 11, wherein the iterative updating of the value of the error locator polynomial is performed based on a Berlekamp-Massey algorithm.

15. The method of claim 11, further comprising:
    receiving the error locator polynomial from the error locator polynomial determination module; and
    analyzing the value of the error locator polynomial at a plurality of points in a domain of the error locator polynomial, wherein the evaluation at a given point comprises:
       determining a value of the error locator polynomial at the point; and
       determining a value of a derivative of the error locator polynomial at the point.

16. The method of claim 15, wherein the analyzing the value of the error locator polynomial at a plurality of points is performed based on a modified Chien search.

17. The method of claim 11, further comprising:
    determining whether a double root condition is present in the error locator polynomial; and
    declaring a decoding failure in response to determining that the double root condition is present.

18. The method of claim 11, further comprising terminating a scheduled modified Chien search in response to a determination that a current degree of the error locator polynomial exceeds a threshold value.

19. The method of claim 11, further comprising determining:
- a plurality of locations in the received codeword that include a symbol error; and
- an error value associated with each of the determined plurality of locations.

20. The method of claim 11, further comprising computing a discrepancy parameter based on the error locator polynomial and the plurality of syndrome values.

* * * * *